United States Patent [19]

Cyr et al.

[11] 4,349,620
[45] Sep. 14, 1982

[54] SOLVENT DEVELOPABLE PHOTORESIST FILM

[75] Inventors: Clifford R. Cyr, Athens, Pa.; Nancy C. Hagan, East Brunswick, N.J.

[73] Assignee: E. I. Du Pont de Nemours and Company, Wilmington, Del.

[21] Appl. No.: 217,505

[22] Filed: Dec. 17, 1980

Related U.S. Application Data

[63] Continuation of Ser. No. 49,210, Jun. 15, 1979, abandoned.

[51] Int. Cl.³ .............................................. G03C 1/58
[52] U.S. Cl. .................................... 430/259; 430/258; 430/271; 430/273; 430/277; 430/311; 430/502; 428/212; 156/661.1
[58] Field of Search ............... 430/260, 261, 262, 273, 430/502, 259, 277, 311, 258; 428/212; 156/661.1

[56] References Cited

U.S. PATENT DOCUMENTS

| | | | |
|---|---|---|---|
| 3,469,982 | 9/1969 | Celeste | 430/260 |
| 3,615,475 | 10/1971 | Skarvinko | 430/502 |
| 3,674,534 | 7/1972 | Connair | 430/502 |
| 3,861,921 | 1/1975 | Hoffmann et al. | 430/273 |
| 3,905,815 | 9/1975 | Bonham | 430/156 |
| 3,924,041 | 12/1975 | Miyayama et al. | 428/212 |
| 3,934,057 | 1/1976 | Moreau et al. | 427/43 |
| 4,024,293 | 5/1977 | Hatzakis | 427/43 |
| 4,050,936 | 9/1977 | Takeda | 430/253 |
| 4,126,466 | 11/1978 | Roos | 430/271 |

FOREIGN PATENT DOCUMENTS 2658422  6/1978  Fed. Rep. of Germany.

*Primary Examiner*—J. Travis Brown

[57] ABSTRACT

A multi-layer photosensitive film resist (is provided) in which the photosensitive layers consists of a plurality of layers having different properties, e.g., greater adhesion to a copper surface provided by one layer and greater toughness and (possibly) reduced adhesion to a temporary support provided by the other layer.

18 Claims, No Drawings

SOLVENT DEVELOPABLE PHOTORESIST FILM

This is a continuation of application Ser. No. 049,210, filed June 15, 1979, now abandoned.

TECHNICAL FIELD

This invention relates to photopolymerizable resist film and more particularly to such film in which multiple layers of photopolymerizable composition are present.

BACKGROUND ART

U.S. Pat. No. 3,469,982 discloses a negative acting photopolymerizable film resist in which a photopolymerizable layer is sandwiched between a temporary support film and a temporary cover film. This film has gained widespread usage in the manufacture of printed circuits in which the cover film is removed, the photopolymerizable layer is laminated by heat and pressure to the surface, e.g., copper, of a substrate to be permanently modified, the layer is imagewise exposed to actinic radiation, the film support is removed, the unexposed areas of the layer are removed by solvent washout (development), and the resultant bared area of the copper surface is permanently modified, such as by etching or deposition of metal.

The photopolymerizable layer has to be nontacky so as to be handleable and not cold flow and yet has to have sufficient adhesion to the substrate surface and integrity (toughness) to survive solvent development. Achievement of this adhesion is not instantaneous upon lamination but increases with time. A hold-up time of about thirty minutes or more and sometimes heating the layer may be required for sufficient adhesion that the support film can be removed without causing separation of the layer from the substrate surface. This holding time has the disadvantage of delaying the next processing step toward the manufacture of the printed circuit.

Attempts to decrease the hold-up time and to increase adhesion by changes in the composition of the photopolymerizable layer have detracted from other properties of the layer, e.g., reduced integrity during solvent development and/or reduced resistance to plating solutions. Changes in the compositions of the photopolymerizable layer to increase its ability to withstand solvent development tend to reduce adhesion of the layer to the substrate surface while increasing adhesion to the support film, making it difficult to remove the support film without detaching the photopolymerizable layer from the substrate surface.

Superimposed over these needs for faster and greater adhesion and greater integrity has been the desire for thinner photopolymerizable layers for economy, which increases the difficulty of satisfying these needs.

DISCLOSURE OF INVENTION

The present invention provides a process for making a thermoplastic photosensitive film resist which satisfies the needs of increased adhesion to the substrate surface with reduced hold-up time, without sacrifice in integrity needed for the solvent development step, and at the same time, reduced layer thickness. More specifically, the process of the present invention involves changing the usual procedure of applying the photosensitive composition to the temporary support film to form a laminate of a layer of the composition on the support film, which layer is to be adhered eventually to a substrate surface. The change in the usual procedure is prior to applying the photosensitive composition to the support film, a second thermoplastic photosensitive composition is applied to the support film to form a laminate of a photosensitive layer on the support film and then the first-mentioned photosensitive composition is applied to the exposed surface of the layer of the second photosensitive composition, the layer of second photosensitive composition having a lesser adhesion to the support film than the adhesion of the layer of the first-mentioned photosensitive composition to the copper surface and a greater adhesion to the layer of the first-mentioned photosensitive composition than to the support film.

The multiple thermoplastic photosensitive layers of the resultant photoresist film can each be considered partial layers of the combined thickness of the photosensitive layers.

A cover film can be laminated to the exposed surface of the layer of the first-mentioned photosensitive composition. In the resultant laminate, the adhesion of the cover film to the layer of first-mentioned photosensitive composition is less than the adhesion of the support film to the layer of the second photosensitive layer to enable the cover film to be stripped from the layer of the first-mentioned photosensitive composition without layer separation or separation of the support film from the layer of second photosensitive composition. The layer of the first-mentioned photosensitive composition, however, has greater adhesion to a substrate surface of copper than the adhesion of the layer of second photosensitive composition to the support film to enable the support film to be stripped away without causing the partial layers to separate from each other or from the substrate surface.

The layer of the first-mentioned photosensitive composition can have improved instant adhesion and high adhesion to the substrate surface by selection of appropriate composition for this layer and still survive solvent development by virtue of the layer of second photosensitive composition having greater resistance to solvent development. While the layer of the first-mentioned photosensitive composition has high adhesion to the substrate surface, the layer of second photosensitive composition has relatively low adhesion to the support film to permit the support film to be easily stripped away without detaching the photosensitive layer from the substrate surface.

DETAILED DESCRIPTION OF THE INVENTION AND BEST MODE

The components used in the process of the invention will first be described and then details of each component will be described, each with reference to the current commercially available types of thermoplastic photosensitive film resist, namely photopoymerizable film resist.

The layer of second photopolymerizable (photosensitive) composition or simply, the second layer may be applied by conventional means to the support film from a solution and is then dried. The layer of the first-mentioned photopolymerizable (photosensitive) composition, or simply the first layer may be applied as a solution or preformed layer to the second layer by conventional means to obtain high adhesion between these layers. Preferably, a cover film is laminated to the bare surface of the first layer so that the first and second photopolymerizable (photosensitive) layers are sandwiched between and protected by the support film and cover film. Upon removal of the cover film, the uncovered (bare) surface of the first layer can be laminated to a substrate surface and processed to form a resist image on the surface.

The first layer in contact with the substrate surface of a substance, usually copper, has high adhesion to the surface as well as to the second layer.

The second layer preferably has a lower adhesion to the support film than would the first layer if it had originally been applied to the support film. This makes it easier to remove the support film without removing the first layer from the substrate or surface of the second layer from the first layer.

The second layer may be considered a release layer for the support film of the photoresist film. This layer stays with the first layer, however, upon stripping away of the support film. As such, the second layer plays an important part of the process to form a resist image on the substrate surface. The second layer can also protect the first layer during the solvent development step and subsequent processing. The second layer also supplements the thickness of the first layer to prevent or minimize mushrooming that could occur in electroplating of the substrate surface.

The first and second layers have a similar photospeed and are developable with the same solvent so that the complete thickness of the first and second layers can be washed away in a single development step to leave a resist image of both layers on the substrate surface.

The combination of first and second layers is more effective than a single layer of the same total thickness and entire composition of these multiple layers.

The thickness of the combination of layers will depend on the permanent modification to be used on the substrate surface. Generally, the etching resist image can be thinner than resist image for deposition of metal. In the latter case, the total thickness will generally be no greater than 0.06 mm. For etching, the total thickness will generally be no greater than 0.04 mm. and preferably, no greater than 0.03 mm. Generally, the layers will each comprise 10 to 90% of their combined thickness. Preferably, the second layer will comprise 20 to 60% of the combined thickness of the layers.

Any of the support films and cover films known for use as such for a photoresist film can be used in the present invention. Preferably, the support film is polyethylene terephthalate and the cover film is polyethylene, both films being oriented for strength.

The first and second photopolymerizable (photosensitive) layers preferably each comprise polymer binder, monomer, and photoinitiator and are dry to the touch. Typically, these components will comprise 40 to 90, 10 to 40, and 1 to 10 percent of the total weight of these three components. Each of these components can be a single ingredient or a plurality thereof to serve the intended function in the composition.

The preferred binder is acrylic polymer, in which at least 40% of the weight of the binder is derived from one or more acrylic units, i.e., acrylic acid, methacrylic acid, and esters and nitriles thereof. Examples of such polymers are poly(methyl methacrylate) and copolymers and terpolymers thereof with acrylic acid, methacrylic acid, $C_2$–$C_5$ alkyl acrylates, styrene, and acrylonitrile. Styrene/maleic anhydride and styrene/butadiene, and poly(vinylacetate), copolymers can also be used.

High adhesion of the first layer to copper may be obtained by using a relatively low molecular weight binder that adheres to copper, the relative low molecular weight of the binder enabling the composition to conform to and form an intimate contact with the copper surface. Other ingredients in the composition may also contribute to this conformability. For example, the binder can be an acrylic polymer or mixture of acrylic polymers having an average molecular weight in the range of 20,000 to 125,000. The layer can also contain an additive such as benzotriazole which increases adhesion to copper.

The same binder can be used in the second layer and its adhesion to the support film reduced by adding polycaprolactone to the second layer. Preferably, the binder is of substantially higher molecular weight (higher intrinsic or inherent viscosity), e.g., greater than an average of 150,000, in the second layer so as to increase the integrity or toughness of the second layer. Instead of or in mixture with acrylic polymer as the binder in the second layer, polymers such as chlorinated rubber, butadiene/acrylonitrile, and cellulose acetate butyrate polymers can be used.

The monomer and photoinitiator used in each of the layers are conventional ingredients. Examples of monomers are trimethylol-propane traacrylate, ethylene glycol diacrylate, diethylene glycol diacrylate, pentaerythritol triacrylate and tetraethylene glycol diacrylate. Examples of photoinitiators are benzophenone and Michler's ketone and mixtures thereof, hexaarylbisimidazoles and leuco dyes.

Other binder, monomer, and photoinitiator components that can be used in the present invention are those disclosed in U.S. Pat. No. 4,054,483. The photopolymerizable (photosensitive) layers may also contain other adjuvants, such as plasticizers, inhibitors and colorants.

Preferably, the low molecular weight or non-polymeric components of the first and second layers, principally monomer, photoinitiator and plasticizer, if any, are substantially the same in each layer and are present in substantially the same amount in each layer. This provides storage stability to the multi-layer photoresist film because these are the diffusible components of the layers. The greater the similarity as set forth, the less the tendency of diffusion of components to occur, which would tend to erase property differences between layers. The property difference can then be established and maintained by relatively non-diffusible components such as the binder component being of higher molecular weight in the second layer.

The negative acting multiple layer photoresist film of the present invention can be used in the same manner as the single layer film described in U.S. Pat. No. 3,469,982.

Other thermoplastic photosensitive layers can be used to make multi-layer photoresist film according to the present invention in the same manner as the photopolymerizable compositions described hereinbefore. Photopolymerizable compositions are a specie of photohardenable compositions, i.e., compositions which increase in molecular weight upon exposure to actinic radiation, and are therefore negative working. The thermoplastic photohardenable compositions, generally, are useful in the present invention. Another specie of photohardenable composition is the photocrosslinkable composition, such as disclosed in U.S. Pat. No. 3,526,504. In this type reaction, the actinic radiation causes polymer crosslinking or dimerization, one crosslink for each photon of radiation, as distinguished from the chain-propagating type of reaction involved for photopolymerizable compositions.

Positive-working thermoplastic photosensitive layers can also be used in the present invention. Examples of positive-working layers are those that are of photosolubilizable compositions such as the polymers having pendant recurring o-quinone diazide groups as disclosed in U.S. Pat. No. 3,837,860 and the desensitizable compositions such as the compositions disclosed in U.S. Pat. No. 3,778,270 wherein the exposed area of the layer is rendered non-crosslinkable to treatment by ammonia fumes (the ammonia crosslinks the unexposed area of the layer) and in Belgian Pat. No. 852,517 wherein exposure to a certain wavelength of radiation renders the exposed area of the layer non-reactive to subsequent radiation which then polymerizes the originally unexposed area of the layer.

The same properties, e.g., adhesion and integrity, can be amplified in first and second layers, respectively, of these other thermoplastic photosensitive layers, as in the case of the photopolymerizable layers. For example, the polymer component whether it be the binder or photosensitive component of these layers, can be of higher molecular weight in the second layer than in the first layer so as to give the second layer greater integrity. The first layer can contain benzotriazole.

The use of the multi-layer photoresist films of these other photosensitive layers as a resist will depend on the particular photosensitive compositions involved. The foregoing mentioned patents (U.S. Pat. Nos. 3,778,270 and 3,837,860 and Belgian Pat. No. 852,517) disclose the manner of use of such compositions, which are used in the same manner in the present invention.

Examples of the present invention are as follows (parts and percents are by weight unless otherwise indicated):

EXAMPLE 1

This Example shows the preparation of a multiple-layer photoresist film in accordance with the present invention.

Two photoresist film elements are comprised of a photopolymerizable layer sandwiched between a 0.025 mm polyethylene film. The photopolymerizable layer of one element, Element A, is 0.018 mm thick and has the following composition:

| Component | Parts By Weight |
|---|---|
| Poly(methyl methacrylate), inh. vis. ~0.21 | 35 |
| Poly(methyl methacrylate), inh. vis. ~1.37 | 20 |
| Trimethylolpropane triacrylate | 35 |
| Triethylene glycol diacetate | 8.5 |
| Michler's ketone | 0.33 |
| Benzophenone | 0.66 |
| Benzotriazole | 0.1 |
| Solvent Red (CI 109) | 0.45 |

The photopolymerizable layer of the second element, Element B, is 0.038 mm thick and has the following composition:

| Component | Parts By Weight |
|---|---|
| Poly(methyl methacrylate), inh. vis. ~0.21 | 34 |
| Poly(methyl methacrylate), inh. vis. ~1.37 | 22 |
| Pentaerythritol triacrylate | 35 |
| Triethylene glycol diacetate | 5 |
| 2-Tertiary butyl anthraquinone | 3.5 |
| 2,2'-Methylene-bis-(4-ethyl-6-tert-butyl phenol) | 0.37 |
| Grasol Fast Brilliant Red BL | 0.13 |

The polyethylene cover sheets are removed from a sample of Element A and Element B, and the uncovered photopolymerizable layer of each is laminated to a clean copper surface of a copper clad epoxy fiberglass board using a hot roll laminator where the rolls are heated to 75°–85° C. and where the lamination rate is 12 dm per minute. Sixty seconds after lamination the polyethylene terephthalate support film is stripped from the laminated element. In the instance when Element A is used, the support film is difficult to remove indicating strong adhesion to both the copper surface and the support film. Such strong adhesion to the support film can cause detachment of small portions of the photopolymer layer particularly when the laminated film is imagewise exposed to actinic radiation. In the instance when Element B is used, the entire photopolymer layer is removed with the support film indicating the total lack of instant adhesion of the photopolymer to the copper surface. In an instance when Element B is laminated to copper and the support film is stripped from the laminated element after a prolonged thirty minute delay, the support film is easily removed with no indication of detachment.

A two-layer photopolymer element is prepared by removing the polyethylene cover sheets from a sample of Element A and a sample of Element B and then laminating the two uncovered photopolymer layers together in surface to surface contact. The laminated two-layer element is then placed on a flat surface with the Element A portion uppermost, and the polyethylene terephthalate support film is carefully removed from the layer A by slowly peeling the film back over itself (180° angle). The uncovered surface (layer A) of the two layer element is then laminated to a cleaned copper surface as described above and sixty seconds after lamination the support film is easily removed from the laminated element with no photopolymerizable material adhered thereto indicating that the two layer element has the instant adhesion qualities of Element A with easy support film removal qualities of Element B. In use as a photoresist to make copper printed circuits, the two layer element has the advantageous lamination characteristics of Element A as well as processing characteristics of the more durable Element B.

EXAMPLE 2

This Example shows the preparation of a multiple-layer photoresist film having a different composition.

A first coating solution is prepared having the following composition.

| Components | Grams |
|---|---|
| Methyl methacrylate(96%)/ethyl acrylate(4%)copolymer, inh. vis. ~0.54 | 4960 |

-continued

| Components | Grams |
|---|---|
| Triethylene glycol dimethacrylate | 1760 |
| Trimethylolpropane triacrylate | 880 |
| 2,2'-Bis(2-chlorophenyl)-4,4',5,5'-tetraphenyl biimidazole | 320 |
| Leuco Crystal Violet | 56 |
| Benzotriazole | 32 |
| Solvent Red 109 | 12 |
| Methanol | 300 |
| Methylene chloride | 11010 |

The coating solution is coated on a 0.025 mm thick polyethylene terephthalate film web and dried to give a dry coating thickness of 0.051 mm. A 0.025 mm thick polyethylene film is laminated to the dried coating and the laminated single-layer element is stored as a roll.

The polyethylene film is removed from a sample of the single-layer element and the following second coating solution is overcoated on the photopolymerizable layer and dried.

| Components | Grams |
|---|---|
| Copolymer of methyl methacrylate (46%), acrylonitrile(9%), butadiene(14%) and styrene(31%) | 21 |
| Triethylene glycol dimethacrylate | 4 |
| Trimethylolpropane triacrylate | 2 |
| 2,2'-Bis(2-chlorophenyl)-4,4',5,5'-tetraphenyl biimidazole | 0.8 |
| Leuco Crystal Violet | 0.14 |
| Benzotriazole | 0.02 |
| Triisononyl trimellitate | 0.5 |
| Methylene chloride | 100 |

The total dried two-layer coating thickness is 0.062 mm.

The uncovered photopolymerizable surface of the two-layer element is laminated to a clean copper surface of a 15×7.6 cm copper-clad, epoxy fiberglass board using a roll laminator of Example 1 but at room temperature. After removing the cover sheet from a sample of the single-layer element, the uncovered photopolymerizable layer is similarly laminated to a cleaned copper-clad board. The adhesive force, expressed in grams/centimeter, of each photopolymer surface to the copper surface is measured using an Instron® Model TTB Tensil Tester instrument by measuring the force to peel the photopolymer layer and support film back across and parallel to the top surface of the laminated support, i.e., about 180° C. from the leading edge of the support. In an instance when the adhesive force is measured immediately after lamination, only 36 g/cm are required to remove the single-layer element from copper, whereas, greater than 790 g/cm are required to remove the two-layer element. In an instance when the adhesive force is measured one hour after lamination, the force required to remove the single-layer increases to 154 g/cm, however, for the two-layer element only the support film is removed leaving both photopolymer layers firmly adhered to the copper substrate.

A second sample of the two-layer element is laminated to a copper substrate as in Example 1, is exposed for 40 sec. through a line image transparency (i.e., having 0.051 mm opaque lines separated by 0.051 mm) to actinic light using a Scannex®II Exposure Source (Colight, Inc. Minneapolis, Minn.). After removal of the support film and development for 100 seconds in trichloroethylene in a Riston® Type C Processor, a resist image containing all lines of the original transparency is obtained.

Instant adhesion of the two-layer element can be further improved by replacing the copolymer and triisononyl trimellitate in the second coating solution with 21 g of acrylonitrile (19%)/butyl acrylate(29%)/methyl methacrylate (50%)/methacrylic acid (2%) copolymer, (low M.W.) and 1 g triethylene glycol diacetate. When the adhesion is measured immediately after lamination, only the support film is removed leaving both photopolymerizable layers adhered to the copper substrate.

The properties of the photoresist film of this Example are unchanged after aging for thirty (30) days at 40° C. Similar storage stability is present in the photoresist films of the remaining Examples.

EXAMPLE 3

This Example shows the preparation of an improved multiple-layer photoresist film.

A first coating solution is prepared having the following composition:

| Components | Grams |
|---|---|
| Poly(ethyl methacrylate) inh. vis. ~0.92 | 2800 |
| Triethylene glycol dimethacrylate | 528 |
| Trimethylolpropane triacrylate | 528 |
| 2,2'-Bis(2-chlorophenyl)-4,4',5,5'-tetraphenyl biimidazole | 120 |
| Leuco Crystal Violet | 2 |
| Benzotriazole | 8 |
| Tris-(4-diethylamino-o-tolyl)methane | 14 |
| Methylene chloride | 8129 |

The coating solution is coated on a 0.025 mm thick polyethylene terephthalate film web and dried to give a dry coating thickness of 0.038 mm. A sample of the coating is overcoated with the following second coating solution and dried:

| Components | Grams |
|---|---|
| Acrylonitrile(19%)/butyl acrylate (29%)/methyl methacrylate(50%)/methacrylic acid(2%)copolymer (low M.W.) | 225 |
| Methyl methacrylate(87%)/Ethyl acrylate(13%)copolymer, inh. vis. ~0.45 | 100 |
| Triethylene glycol dimethacrylate | 76 |
| Trimethylolpropane triacrylate | 75 |
| 2,2'-Bis(2-chlorophenyl)-4,4',5,5'-tetraphenyl biimidazole | 20 |
| Leuco Crystal Violet | 0.5 |
| Benzotriazole | 1 |
| Tris-(4-diethylamino-o-tolyl)methane | 2 |
| Victoria Green | 0.5 |
| Methylene chloride | 3670 |

The total dried two-layer coating thickness is 0.046 mm.

The uncovered photopolymerizable surface of the two-layer element is laminated to the abrasively cleaned copper surface of a 18×23 cm copper-clad, epoxy fiberglass board using a Riston® Model A24 hot roll laminator at a roll temp. of about 105° C. As in Example 2, the laminated element is imagewise exposed for fifty seconds, the support film removed, and the imaged element developed for eighty seconds to produce a resist image containing all the lines of the original transparency. The copper not covered by the resist image is removed by etching in 42° Be' ferric chloride solution, the resulting image is rinsed and the resist image is removed from the protected copper image by washing with methylene chloride. When examined under magnification, the etched lines have sharp straight sides indicating no adhesion failure during the support film removal, development, or etching steps.

EXAMPLE 4

This example shows the tenting performance of a two-layer resist compared to that of a single layer resist of equal composition.

A coating solution (Solution A) is prepared by adding the following ingredients to 5625 grams of methylene chloride:

| Components | Grams |
|---|---|
| Poly(methyl methacrylate), inh. vis. ~1.38 | 188 |
| Methyl methacrylate(91%)/ethyl acrylate(9%)copolymer, inh. vis. ~1.8 | 225 |
| Methyl methacrylate(96%)/ethyl acrylate(4%)copolymer, inh. vis. ~0.45 | 675 |
| Copolymer of methyl methacrylate(46%), acrylonitrile(9%), butadiene(14%) and styrene(31%) | 1.13 |
| Tris-(4-diethyl amino-o-tolyl)methane | 3.75 |
| Trimethylolpropane triacrylate | 381 |
| Tetraethylene glycol diacrylate | 112 |
| 2,2'-Bis(2-chlorophenyl)-4,4',5,5'-tetraphenyl biimidazole | 46.9 |
| Michler's ketone | 2.25 |
| Benzophenone | 120 |
| Benzotriazole | 3.75 |
| Victoria Green | 0.66 |
| Monastral Green 751G | 1.13 |
| p-Toluene sulfonic acid | 0.94 |
| Toluene sulfonamide | 112 |
| Leuco Crystal Violet | 1.9 |

A portion of Solution A is coated on a 0.025 mm polyethylene terephthalate film support and dried by passing it through an oven at 93° C. to give a dried coating, Coating A, with a thickness of 0.006 mm.

A second coating solution (Solution B) is prepared by adding the following ingredients to 3000 grams of methylene chloride:

| Component | Grams |
|---|---|
| Poly(methyl methacrylate), inh. vis. ~1.38 | 582 |
| Methyl methacrylate(91%)/ethyl acrylate(9%)copolymer, inh. vis. ~0.43 | 1158 |
| Copolymer of methyl methacrylate(46%), acrylonitrile(9%), butadiene(14%) and styrene(31%) | 1.8 |
| Trimethylolpropane triacrylate | 609 |
| Tetraethylene glycol dimethacrylate | 180 |
| 2,2'-Bis(2-chlorophenyl)-4,4',5,5'-tetraphenyl biimidazole | 75 |
| Michler's ketone | 3.6 |
| Benzotriazole | 6 |
| Benzophenone | 191 |
| Victoria Green | 1.05 |
| Monastral Green 751G | 1.8 |
| p-Toluene sulfonic acid | 1.5 |
| Leuco Crystal Violet | 3 |
| Tris-(4-diethyl amino-o-tolyl) methane | 6 |
| Toluene sulfonamide plasticizer | 180 |

A portion of Solution B is overcoated onto the first Coating a and dried by passing it through the oven at 93° C. The total dried two-layer, coating thickness is 0.038 mm.

A third coating solution, Solution C, is prepared by throughly mixing 1000 grams of Solution A with 3125 grams of Solution B. Solution C is coated on a 0.025 mm polyethylene terephthalate film support and dried by passing it through an oven at 93° C. The dried single-layer coating has a thickness of 0.038 mm and a chemical composition equivalent to the two-layer coating.

The uncovered surfaces of two samples of the two-layer coating and two samples of the single-layer coating are laminated using a Riston ® Model HRL-24 Hot Roll Laminator at 140° C. to both sides of cleaned copper-clad panels through which 100 holes of each of the following diameters are drilled: 6.35 mm, 4.44 mm, 3.18 mm, 2 mm, 1 mm. Each laminated panel is irradiated conventionally with a high pressure mercury vapor lamp on both sides through a phototool to leave exposed photoresist ("tests") over both sides of each hole. The polyethylene terephthalate film support is removed from each side of each panel and the panels are developed by removing unexposed resist areas with a methyl chloroform spray. None of the "tents" of either coating type are broken. The developed panels are next passed through a high pressure hot water spray (54° C.) to test the spray impact resistance of the "tents". The number of "tents" broken during spraying are tabulated as follows:

| Film | % of Tents Broken in High Pressure Spray | | | | |
|---|---|---|---|---|---|
| | 6.35mm | 4.44mm | 3.18mm | 2mm | 1mm |
| Two-Layer | 62 | 35 | 22 | 7 | 4 |
| Single-Layer | 94 | 82 | 70 | 24 | 6 |

Substantially fewer "tents" ruptured when the two-layer resist film was used as compared to the single-layer film of essentially the same composition.

EXAMPLE 5

The use of a release additive in a dual layer photoresist film is demonstrated wherein support film adhesion is reduced without adversely affecting the resist tenting characteristics.

A coating solution is prepared by adding the following ingredients to 1400 grams of methylene chloride:

| Components | Grams |
|---|---|
| Poly(methyl methacrylate), inh. vis. ~1.38 | 35 |
| Methyl methacrylate/ethyl acrylate copolymer, inh. vis. ~1.8 | 169 |
| Methyl methacrylate/ethyl acrylate copolymer, inh. vis. ~0.45 | 41 |
| Methyl methacrylate/acrylic acid copolymer, M.W. 20,000 | 15.6 |
| Trimethylolpropane triacrylate | 72.5 |
| Tetraethylene glycol diacrylate | 72.5 |
| 2,2'-Bis(2-chlorophenyl)-4,4',5,5'-tetraphenyl biimidazole | 4.7 |
| Michler's ketone | 0.56 |
| Benzophenone | 18.75 |
| Benzotriazole | 0.94 |
| Victoria Green | 0.16 |
| p-Toluene sulfonic acid | 0.24 |
| Toluene sulfonamide | 28.5 |
| Leuco Crystal Violet | 0.5 |

To one-half of the coating solution is added 4.7 grams of polycaprolactone (M.W. 15,000). To the other half is added 4.7 grams of the same methyl methacrylate/acrylic acid copolymer of the coating solution. Each of the resulting coating solutions is coated on a separate, 0.025 mm polyethylene terephthalate film support and dried by passing it through a 93° C. oven to give a dried coating thickness of about 0.013 mm.

Another coating solution is prepared by adding the following ingredients to 1190 grams of methylene chloride:

| Components | Grams |
| --- | --- |
| Poly(methyl methacrylate), inh. vis. ~1.38 | 75 |
| Methyl methacrylate/ethyl acrylate copolymer, inh. vis. ~0.54 | 182 |
| Methyl methacrylate/ethyl acrylate copolymer, inh. vis. ~0.43 | 175 |
| Trimethylolpropane triacrylate | 116.25 |
| Tetraethylene glycol diacrylate | 116.25 |
| 2,2'-Bis(2-chlorophenyl)-4,4',5,5'-tetraphenyl biimidazole | 7.5 |
| Michler's ketone | 0.9 |
| Benzophenone | 3.0 |
| Benzotriazole | 1.5 |
| Victoria Green | 0.26 |
| p-Toluene sulfonic acid | 0.38 |
| Toluene sulfonamide | 45 |
| Leuco Crystal Violet | 0.75 |

Each of the previous coatings is overcoated with this solution and dried by passing through a 93° C. oven. The total two-layer coating thickness in each case is about 0.025 mm.

The top surface of samples of each two-layer coating is laminated to a copper substrate as in Example 4 and the support film peel force measured as described in Example 2 except that an Instron ® Model 1130 Universal Testing Instrument was used and only the support film was removed. The peel force for the coating without polycaprolactone is 5.9 grams/cm in contrast to 3.5 grams/cm for the coating with polycaprolactone.

Two samples of each two-layer coating are laminated as in Example 4 to both sides of cleaned, copper-clade panels containing through holes. As in Example 4 each laminated panel is irradiated and developed. None of the "tents" of either resist coating type were broken. The panels were next passed through a high pressure spray as in Example 4. The number of "tents" broken during spraying are tabulated as follows:

| Film | % of Tents Broken in High Pressure Spray | | | | |
| --- | --- | --- | --- | --- | --- |
| | 6.35mm | 4.44mm | 3.18mm | 2mm | 1mm |
| With polycaprolactone | 6 | 5 | 4 | 1 | 0 |
| Without polycaprolactone | 6 | 5 | 2 | 0 | 0 |

The two-layer resist with polycaprolactone substantially decreases support film adhesion, but its ability to protect holes on a circuit board is not significantly changed.

The inherent viscosities disclosed in the Examples are determined for a solution of 0.25 g of polymer in 5 ml of chloroform at 20° C. using a No. 50 Cannon Fenske viscometer. The inherent viscosities correspond to molecular weight approximately as follows:

| Inherent Viscosity | Molecular Weight |
| --- | --- |
| 0.45 | 100,000 |
| 0.54 | 150,000 |
| 1.4 | 250,000 |
| 1.8 | 300,000 |

As many apparently widely different embodiments of this invention may be made without departing from the spirit and scope thereof, it is to be understood that this invention is not limited to the specific embodiments thereof except as defined in the appended claim.

We claim:

1. In the process of making a photoresist film by applying a thermoplastic photosensitive composition to a temporary support film to form a laminate of a thermoplastic photosensitive layer on said support film, with the exposed surface of said layer having greater adhesion to a copper surface than to said support so that said layer is transferrable to said copper surface, the improvement comprising prior to applying said photosensitive composition to said support, applying a second thermoplastic photosensitive composition to said support film to form a laminate of a thermoplastic photosensitive layer on said support film and then applying the first-mentioned photosensitive composition to the bare surface of the layer of said second photosensitive composition, said layer of said second photosensitive composition having a lesser adhesion to said support film than the adhesion of said layer of said first-mentioned photosensitive composition to said copper surface, and a greater adhesion to the layer of said first-mentioned photosensitive composition than to said support film, the above general adhesion relationships of the photosensitive compositions of the partial layers being unchanged by exposure to actinic radiation.

2. In the process of claim 1 wherein the layer of said second photosensitive composition also has a lesser adhesion to said support film than the layer of said first-mentioned photosensitive composition.

3. In the process of claim 1 wherein each said layer has a similar photospeed and is solvent developable by the same solvent.

4. In the process of claims 1, 2, or 3 wherein said layer of said second photosensitive composition is tougher than said layer of said first-mentioned photosensitive composition.

5. The process of claim 1 wherein each said photosensitive composition is photopolymerizable.

6. In the process of claim 5 wherein each of said layers contains polymer binders and the molecular weight of the binder in the layer of said second photopolymerizable composition is substantially higher than in the layer of said first-mentioned photopolymerizable composition.

7. In the process of claim 6 wherein the binder in each of said layers is acrylic polymer.

8. The process of claim 6 wherein each said layer contains substantially the same monomer and photoinitiator, the amounts in one said layer being substantially the same as in the other said layer.

9. In the process of claim 1 wherein the total thickness of said layers is no greater than 0.06 mm.

10. In the process of claims 1 or 9 wherein the layer of said second photosensitive composition is 20 to 60% of the total thickness of said layers.

11. Dry photosensitive resist film consisting of a temporary support film, thermoplastic photosensitive layer, and cover film, characterized by the photosensitive layer consisting of at least two partial layers, said cover film being strippable from its respective partial layer without removal of said temporary support film from its respective partial layer and the resultant bared surface of said partial layer having greater adhesion to copper than the adhesion of said temporary support film to its respective partial layer, the above general adhesion relationships of the photosensitive compositions of the partial layers being unchanged by exposure to actinic radiation.

12. The film according to claim 11 wherein said photosensitive layer is photopolymerizable and thereby negative working.

13. The film according to claim 12 characterized in that the photopolymerizable layer adjoining the cover film contains binder.

14. Film according to claims 12 or 13 characterized in that the photopolymerizable layers contain at least in one partial layer a dyestuff.

15. Process for producing the negative-dry resist film according to claim 12, by applying the photopolymerizable layer onto the temporary support film from a solution and drying and coating the layer with a cover film, characterized in that the photopolymerizable layer is applied in a continuous operation in at least two partial layers from solution and is dried.

16. Process according to claim 15, characterized in that the photopolymerizable layer is produced by applying and drying different solutions.

17. Photoresist film comprising the support film and photosensitive layers of claim 1 and a cover film laminated to the bare surface of the layer of said first photosensitive composition.

18. In a process for modifying a metal surface of a substrate in which (1) a negative acting dry resist film is laminated to the service; (2) the laminated film is exposed imagewise; and (3) the nonimage areas are removed by washing, thus exposing the metal surface, the improvement comprising utilizing as the negative acting dry resist film, the film of claim 12.

* * * * *